United States Patent [19]

Yevick

[11] Patent Number: 4,696,889
[45] Date of Patent: Sep. 29, 1987

[54] METHOD OF PHOTOFORMING OPTICAL PATTERNS FOR VLSI DEVICES

[76] Inventor: George J. Yevick, 536 Nordhoff Dr., Leonia, N.J. 07605

[21] Appl. No.: 768,700

[22] Filed: Aug. 23, 1985

[51] Int. Cl.⁴ ............................................... G03C 5/00
[52] U.S. Cl. ..................................... 430/311; 430/394; 430/396; 350/96.11; 350/96.18; 350/96.24; 350/96.25
[58] Field of Search ............... 430/311, 394, 494, 396; 350/96.25, 96.27, 96.28, 96.11, 96.18, 96.24

[56] References Cited

U.S. PATENT DOCUMENTS

| | | | |
|---|---|---|---|
| 3,016,785 | 1/1962 | Kapany | 350/96.25 |
| 3,753,607 | 8/1973 | Kitano et al. | 350/96.25 |
| 4,017,962 | 4/1977 | Palmer | 29/572 |

Primary Examiner—John E. Kittle
Assistant Examiner—José G. Dees
Attorney, Agent, or Firm—Thomas J. Greer, Jr.

[57] ABSTRACT

A branched fiber optic assembly having a trunk at one end is employed. Each original optical pattern is individually projected onto the input end of a respective coherent sub-bundle of the fiber optic device. The exiting light from the trunk of the fiber optic assembly is projected onto a single photosensitive surface, such as that of a photosensitized silicon wafer.

10 Claims, 1 Drawing Figure

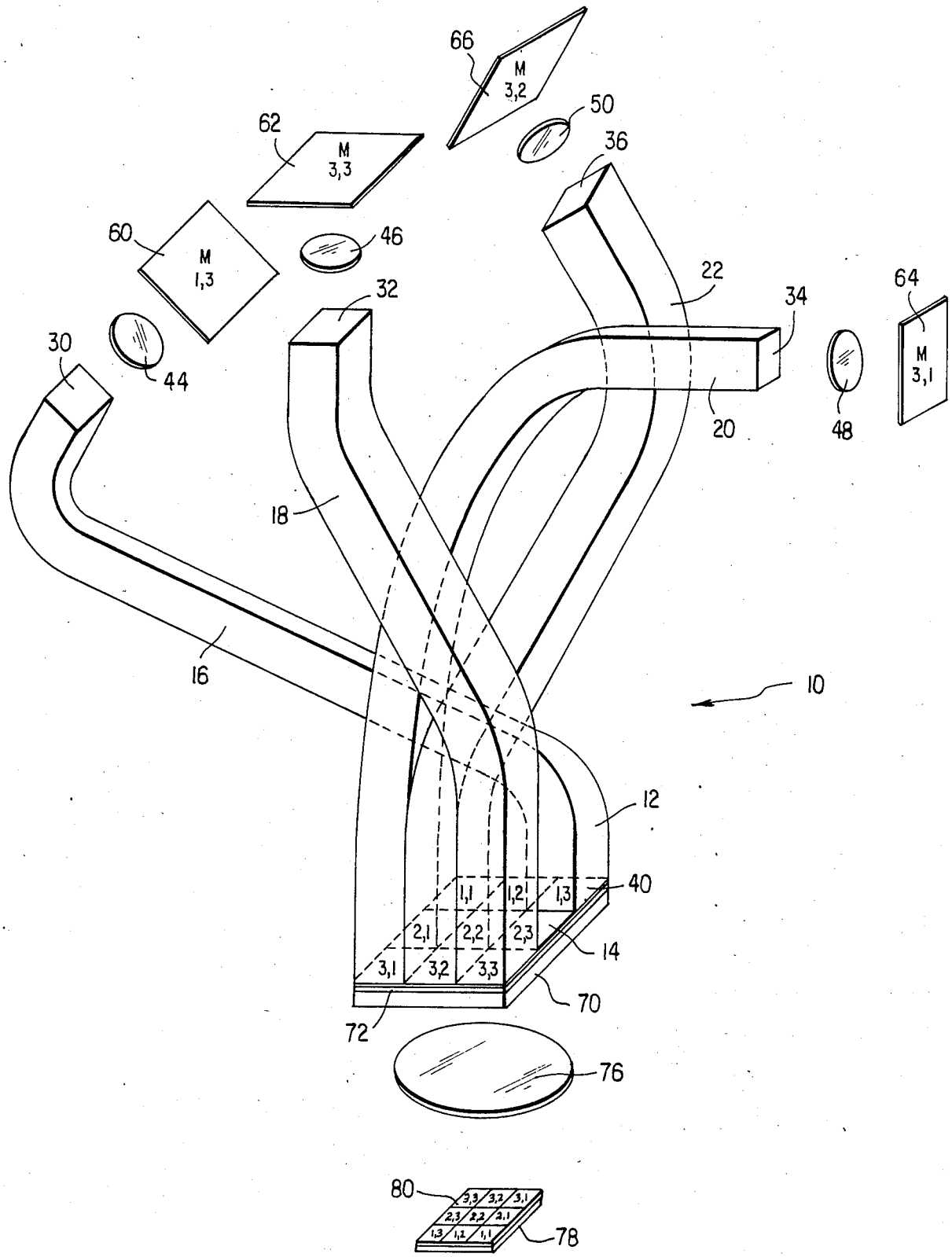

METHOD OF PHOTOFORMING OPTICAL PATTERNS FOR VLSI DEVICES

BACKGROUND OF THE INVENTION

This invention relates to the field of microelectronic optical lithography and more particularly to a method and apparatus for the construction of very large solid state electronic devices sometimes known as VLSI devices.

Prior art optical lithography techniques which are used to produce patterned wafers may be briefly described as follows. A chip pattern is used to fabricate a reticle. The reticle is then placed beneath a source of light, with the light being projected through the reticle (embodying the chip pattern therein) and onto one portion of a wafer, such as a silicon wafer. To make a second chip pattern, the wafer is stepped or indexed relative to the reticle and the source of light, and the process repeated. This continues until the entire usable area of the wafer is exhausted, i.e., completely filled with the chip patterns.

Alternatively, the reticle formed from the original chip pattern may be placed in a step and repeat camera to thereby make a plurality of identical chip patterns on a mask. The mask is then developed and placed in a contact printer. The printer then contacts the wafer, with the same end result. Since contact printing rapidly destroys the mask, a one-to-one projection printer is preferred in mass production.

This process is now repeated for each of the several etching steps which are usually required to produce a patterned wafer. At the completion of this process, the patterned wafer, now containing a plurality of identical chip patterns over its surface with each chip pattern being the result of a plurality of etching, ion implantation, coating, etc. operations, is diced. This dicing results in a plurality of chips of identical electrical and geometrical properties. Such a process is described in an article entitled Electron Lithography for the Fabrication of Mic roelectronic Devices, page 800, et seq., by Geraint Owen, Rep. Prog. Phys. Vol. 48, pp. 795-851, 1985, hereby incorporated by reference.

To make, for example a microcomputer, a chip is placed in a carrier and a plurality of chip carriers are placed on a card, there being suitable electrical connections between the chips of each chip carrier. Typically, a microcomputer consists of a plurality of cards mounted on a board with electrical connections existing between and into the various cards. (The monitor, usually a CRT, is a separate opto-electronic entity.)

Clearly, the use of a plurality of cards and the necessity of mounting a plurality of chip carriers on each card entails significant and expensive operations and techniques.

SUMMARY OF THE INVENTION

According to the practice of this invention, each of a plurality of diverse chip patterns, termed original optical patterns, is projected onto respective and corresponding (spaced apart) optical input ends of coherent fiber optic bundles. The optical output ends of the coherent fiber optic bundles are bunched together to thereby form a trunk. Upon the projection of light through the original optical patterns, these patterns are caused optically to come together and to exit from the optical output surface of the trunk. The trunk optical output is then directed onto a photosensitive layer carried by a substrate. Alternatively, the output from the trunk may be first passed through a lens, such as a high resolution, wavelength limited, low reduction lens onto a substrate which has a photosensitive surface thereon.

In distinction to VLSI prior art methods of manufacture, the method of this invention permits the simultaneous projection of different chip patterns (original optical patterns) onto a single photosensitive surface, thereby ensuring complete and accurate optical alignment between the several original optical patterns. This, in turn, yields the desirable result that the electrical elements, paths or terminals of one original circuit pattern are accurately aligned with the desired counterpart terminals on neighboring original optical patterns. Namely, the peripheries of adjacent original optical patterns are in desired alignment or positioning relative to each other.

The practice of this invention thus overcomes inherent limitations of manufacture due to the practical extreme difficulty of alignment of the peripheries of optically projected chip patterns onto a single photosensitive surfaced substrate.

BRIEF DESCRIPTION OF THE DRAWING

The single FIGURE of the drawing is a partially schematic view showing the invention.

Turning now to the drawing, the numeral 10 denotes a branched fiber optic assembly including a trunk 12 and a plurality of coherent optic fiber sub-bundles 16, 18, 20, 22. The trunk is formed by bunching together, in intimate contact, the (lower) ends of the individual sub-bundles. Not all of the sub-bundles are illustrated. Each of the coherent fiber optic sub-bundles carries an optical input end, denoted, respectively, by the numerals 30, 32, 34, and 36. The optic output end of each coherent sub-bundle is coterminous with the other optic output ends, and the numeral 40 denotes the output optical end of coherent fiber optic bundle 16.

The numerals 44, 46, 48 and 50 denote high resolution reduction lenses associated with each respective input face or input end of each respective coherent sub-bundle. The numerals 60, 62 64 and 66 denote reticles or masks, each reticle being a magnified version of a chip pattern. The reticles 60, 62, 64 and 66 may be of identical patterns, or they may be different.

The numeral 70 denotes a substrate, such as a substrate of silicon (a silicon wafer) or glass which carries a photosensitive surface 72 on its top surface. In operation, each reticle is illuminated by its individual source of illumination (not illustrated) such that the circuit pattern on each reticle is projected through its corresponding high resolution reduction lens and falls onto the input end of its respective coherent optic fiber sub-bundle. As will be more fully explained later, this projection may be carried out simultaneously for each of the coherent sub-bundles and its associated reticle. The individual circuit patterns on each of the reticles thus coalesce, so to speak, in an optical manner, on the output surface 14 of trunk 12 of fiber optic assembly 10. This light is then projected onto photosensitive surface 72.

Alternatively, light exiting from surface 14 of trunk 12 may first pass through a high resolution, low reduction lens 76 and onto substrate 78, such as a silicon wafer substrate, which carries a photosensitive layer 80 thereon. Each reticle also bears the designation Ma,b to indicate its final projection position on trunk optical output surface 14 at, for example, imaginary row position a and column position b of that surface.

From a consideration of the drawing, the reader will immediately comprehend the advantage of this process/apparatus. The fiber optic device defined by the trunk 5 and the coherent sub-bundles permits the optical coalescence, in aligned arrangement, between the several circuits on each of the reticles 60, 62, 64 and 66. The reader will again observe that the various chip or reticle circuits may be placed on the photosensitive surface simultaneously, as opposed to the prior art step and repeat process. If desired, each of the reticles 60, 62, 64 and 66 may be identical, as for example would be the case if one wished to construct a memory of large capacity. On the other hand, by the practice of this invention, one can project different chip or reticle patterns onto the input ends of the several coherent sub-bundles to thereby obtain a photographic image of a circuit on photosensitive surface 72 or 80 which can then, by means of well-known techniques on the wafer 70 or 78 be utilized to make a microcompter on a single surface, with all the necessary connections, thereby avoiding the use of chip carriers, cards and boards typical of prior art technology.

It will be readily apparent that each of the coherent fiber optic sub-bundles 16, 18, 20 and 22 need not be all of the same size or shape. In order that what is projected from the output surface 14 of trunk 12 be optically homologous with what is projected into the input ends of the coherent sub-bundles, it is necessary that either each coherent sub-bundle be accurately rotated or the reticles 60, 62, 64 and 66 be accurately positioned vis-a-vis said sub-bundles.

Preferably, the individual optic fibers which form the coherent sub-bundles are formed of amorphores quartz or glass. Either of these materials, among others possible, exhibit extreme stability of physical properties over significant changes in temperature and humidity, i.e., changes in the ambient atmosphere. Also, these materials exhibit very low creepage with age. Clearly, the diverse work stations at the input ends of the sub-bundles should be matched as much as possible with regard to temperatures and humidity.

While illustrated as square, the reader will understand that the individual sub-bundles may be hexagonal in cross-section. The individual fibers themselves may also be hexagonal in cross-section.

The prior art is aware of branched fiber optic assemblies which are similar to those employed in this invention, as may be seen by reference to U.S. Pat. Nos. 3,360,670 issued to Manning and 4,101,188 issued to Yevick. However, neither one of these patents relates to the subject process.

While not illustrated, it will be clear that after the formation of the composite wafer 70 or 78, a plurality of such wafers may be serially joined or may be joined in parallel or a combination of both or any spiral form or in an interleaved form to even further increase the microelectronic or microelectro-optical capability.

The function of the individual sub-bundles 16, 18, 20 and 22 may now be more fully understood in view of the above explanation of the process. Assume, for example, that instead of the individual sub-bundles, one were to optically project the chip pattern from each reticle or mask 60, 62, 64, 66 (Ma,b) directly onto its corresponding portion a, b on photosensitive layer 72. Such an optical projection could obviously be carried out. However, the practical difficulty of aligning the reticles or masks and their associated projection lenses, so that the electrical connections (corresponding to optical matching) between each of the chip patterns on the several reticles or masks are so great that proper alignment between touching peripheries of the chip patterns would be impossible. Thus, with such an optical projection (without the sub-bundles) the electrical terminals of, for example, chip pattern $M_{3,3}$ would not be properly aligned with the corresponding terminals of chip pattern $M_{3,2}$ or $M_{2,3}$. The function of the sub-bundles is thus to insure proper optical alignment, so that what is projected onto photosensitive surface 72 will be a plurality of perfectly peripherally aligned chip patterns. In this manner, the necessity of a separate step of manually (or by automation) coupling the terminals of each chip pattern together is done away with.

Moreover, the decrease in processing time either in the making of the mask or the wafer means less chance of microscopic dirt. Moreover since extremely large scale VLSI now becomes possible increased redundancy in electronic or opto-electronic circuit elements to overcome microscopic defects such as dirt and imperfections becomes practical.

Clearly, although the emphasis has been on making wafer-size chips, the same process/apparatus can be used to make individual reticles, i.e., the device 10 becomes an optical reticle generator. Computer-aided methods are used to design and implement reticle patterns. (See reference previously cited.) The optical patterns are specified by the dimension and position of a pattern "flash". Scores of hours may be required to generate a reticle because hundreds of thousands of flashes are needed. Now, however, it becomes possible to process in parallel sub-portions of the reticle pattern to thereby speed up the making of each individual reticle 60, 62, 64 and 66. Instead of wafer 77 or 78, there will be a glass plate with a thin film of chromium upon which is coated a photo-resist.

Furthermore, it now becomes possible to incorporate not only the microcomputer on a single substrate but also the opto-electronic display. A complete microcomputer can be made on a single substrate. Examples of such opto-electronic displays are liquid crystal, light-emitting diodes, electrochromic, and electroluminescent.

What is claimed is:

1. A method of photoforming a composite optical pattern on a photosensitive surface,, the composite pattern being adapted to be optically imaged on said surface, the method including the steps of (a) optically projecting a plurality of original optical patterns onto at least some of the optical input ends of a plurality of coherent fiber optic sub-bundles, each of said projected original optical patterns being projected onto a responsive one of said input ends, the sub-bundles being bunched together at their other, light output ends to define a trunk of coherent fiber optic bundles, the sub-bundles being separated from each other at their optical input ends, (b) projecting the original optical patterns exiting from said trunk onto said photosensitive surface, (c) processing said photosensitive surface to thereby produce a composite optical pattern, the composite optical pattern consisting of all of those original optical patterns which were projected through the fiber optic sub-bundles, whereby the composite optical pattern is employed to produce electrical circuits on a single substrate.

2. The method of claim 1 wherein said optical projections of the original patterns onto the input ends of the fiber optic sub-bundles are carried out simultaneously.

3. The method of claim 1 wherein the trunk and said photosensitive surface remain fixed relative to each other during steps (a) and (b).

4. The method of claim 1 including the additional step of placing a lens between the exit end of the trunk and the photosensitive surface.

5. The method of claim 4 wherein the lens reduces the size of the original optical patterns exiting from the trunk and passing to the photosensitive surface.

6. The method of claim 1 wherein each fiber optic sub-bundle is hexagonal in cross-section.

7. The method of claim 6 wherein said composite optical pattern is generally hexagonal.

8. The method of claim 1 wherein each optic fiber of each sub-bundle is hexagonal in cross-section, and forms hexagonal sub-bundles.

9. The method of claim 1 wherein the fiber optic sub-bundles are not all of the same cross-sectional area.

10. The method of claim 1 wherein the sides of the optic output ends of adjacent the fiber optic sub-bundles touch each other.

* * * * *